(12) United States Patent
Dando et al.

(10) Patent No.: US 6,814,813 B2
(45) Date of Patent: Nov. 9, 2004

(54) CHEMICAL VAPOR DEPOSITION APPARATUS

(75) Inventors: Ross S. Dando, Nampa, ID (US);
Craig M. Carpenter, Boise, ID (US);
Philip H. Campbell, Meridian, ID (US); Allen P. Mardian, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/132,767

(22) Filed: Apr. 24, 2002

(65) Prior Publication Data
US 2003/0200926 A1 Oct. 30, 2003

(51) Int. Cl.[7] ............................................. C23C 16/00
(52) U.S. Cl. ..................................... 118/719; 414/939
(58) Field of Search ................... 118/719; 156/345.31, 156/345.32; 414/939, 221

(56) References Cited

U.S. PATENT DOCUMENTS

| | | | |
|---|---|---|---|
| 3,618,919 A | | 11/1971 | Beck |
| 4,289,061 A | | 9/1981 | Emmett |
| 4,438,724 A | | 3/1984 | Doehler et al. |
| 4,545,136 A | | 10/1985 | Izu et al. |
| 4,871,417 A | * | 10/1989 | Nishizawa et al. .......... 438/748 |
| 4,948,979 A | * | 8/1990 | Munakata et al. ........ 250/492.2 |
| 4,949,669 A | * | 8/1990 | Ishii et al. .................... 118/719 |
| 5,076,205 A | * | 12/1991 | Vowles et al. ............... 118/719 |

(List continued on next page.)

FOREIGN PATENT DOCUMENTS

| | | | |
|---|---|---|---|
| JP | 63-256460 | 10/1988 | |
| JP | 01273991 A | * 11/1989 | ............. F27D/7/06 |
| JP | 06151558 A | * 5/1994 | ........... H01L/21/68 |
| JP | 1994151558 A | 5/1994 | |
| JP | 6342785 | 12/1994 | |
| JP | 8-34678 | 2/1996 | |
| JP | 2001-82682 | 3/2001 | |
| JP | 2001-261375 | 9/2001 | |

OTHER PUBLICATIONS

U.S. patent application Ser. No. 10/082,599, Carpenter et al., filed Feb. 22, 2002.
U.S. patent application Ser. No. 10/132,003, Dando et al., filed Apr. 24, 2002.
U.S. patent application Ser. No. 10/365,085, Carpenter et al., filed Feb. 11, 2003.

*Primary Examiner*—Parviz Hassanzadeh
*Assistant Examiner*—Karla Moore
(74) *Attorney, Agent, or Firm*—Wells St. John P.S.

(57) ABSTRACT

A chemical vapor deposition apparatus includes a subatmospheric substrate transfer chamber. A subatmospheric deposition chamber is defined at least in part by a chamber sidewall. A passageway in the chamber sidewall extends from the transfer chamber to the deposition chamber. Semiconductor substrates pass into and out of the deposition chamber through the passageway for deposition processing. A mechanical gate is included within at least one of the deposition chamber and the sidewall passageway, and is configured to open and close at least a portion of the passageway to the chamber. A chamber liner apparatus of a chemical vapor deposition apparatus forms a deposition subchamber within the chamber. At least a portion of the chamber liner apparatus is selectively movable to fully expose and to fully cover the passageway to the chamber.

15 Claims, 11 Drawing Sheets

U.S. PATENT DOCUMENTS

| | | | |
|---|---|---|---|
| 5,172,849 A | | 12/1992 | Barten et al. |
| 5,223,113 A | | 6/1993 | Kaneko et al. |
| 5,364,219 A | * | 11/1994 | Takahashi et al. ........... 414/217 |
| 5,445,491 A | * | 8/1995 | Nakagawa et al. .......... 414/805 |
| 5,562,800 A | * | 10/1996 | Kawamura et al. .......... 414/806 |
| 5,592,581 A | * | 1/1997 | Okase ......................... 392/418 |
| 5,626,936 A | | 5/1997 | Alderman |
| 5,640,751 A | | 6/1997 | Faria |
| 5,693,288 A | | 12/1997 | Nakamura |
| 5,746,434 A | | 5/1998 | Boyd et al. |
| 5,769,952 A | | 6/1998 | Komino |
| 5,820,641 A | | 10/1998 | Gu et al. ....................... 55/269 |
| 5,827,370 A | | 10/1998 | Gu .............................. 118/715 |
| 5,940,684 A | * | 8/1999 | Shakuda et al. .............. 438/46 |
| 5,997,588 A | * | 12/1999 | Goodwin et al. ........... 29/25.01 |
| 6,016,611 A | * | 1/2000 | White et al. .................... 34/92 |
| 6,045,620 A | | 4/2000 | Tepman et al. |
| 6,089,543 A | | 7/2000 | Freerks |
| 6,174,366 B1 | * | 1/2001 | Ihantola ....................... 117/84 |
| 6,178,660 B1 | * | 1/2001 | Emmi et al. ................... 34/412 |
| 6,192,827 B1 | * | 2/2001 | Welch et al. ............ 118/723 E |
| 6,193,802 B1 | | 2/2001 | Pang et al. .................. 118/715 |
| 6,194,628 B1 | | 2/2001 | Pang et al. .................. 588/900 |
| 6,197,119 B1 | | 3/2001 | Dozoretz et al. ............ 118/715 |
| 6,200,415 B1 | | 3/2001 | Maraschin |
| 6,255,222 B1 | | 7/2001 | Xia et al. ..................... 438/710 |
| 6,263,829 B1 | | 7/2001 | Schneider et al. |
| 6,280,584 B1 | | 8/2001 | Kumar et al. |
| 6,309,161 B1 | * | 10/2001 | Hofmeister ................. 414/221 |
| 6,347,918 B1 | | 2/2002 | Blahnik |
| 6,506,254 B1 | | 1/2003 | Bosch et al. |
| 6,541,353 B1 | * | 4/2003 | Sandhu et al. .............. 438/478 |
| 6,562,141 B2 | * | 5/2003 | Clarke ........................ 118/719 |
| 6,602,346 B1 | * | 8/2003 | Gochberg et al. ........... 118/715 |
| 6,638,672 B2 | * | 10/2003 | Deguchi ....................... 430/30 |
| 6,673,196 B1 | | 1/2004 | Oyabu |
| 2002/0185067 A1 | | 12/2002 | Upham |
| 2002/0195201 A1 | | 12/2002 | Beer et al. |

* cited by examiner

CHEMICAL VAPOR DEPOSITION APPARATUS

TECHNICAL FIELD

This invention relates to chemical vapor deposition apparatus.

BACKGROUND OF THE INVENTION

Semiconductor processing in the fabrication of integrated circuitry typically includes the deposition of layers on semiconductor substrates. Exemplary processes include physical vapor deposition (PVD), and chemical vapor deposition (CVD) which herein includes atomic layer deposition (ALD). With typical ALD, successive mono-atomic layers are adsorbed to a substrate and/or reacted with the outer layer on the substrate, typically by successive feeding of different precursors to the substrate surface.

Chemical and physical vapor depositions can be conducted within chambers or reactors which retain a single substrate upon a wafer holder or susceptor. The chambers include internal walls which can undesirably have deposition product deposited thereupon in addition to the substrate. This is particularly problematic in ALD and other CVD processes. One existing method of protecting or preserving the internal chamber walls is to shield such from the deposition material with one or more removable liners. These liners might be received immediately adjacent or against the internal chamber walls. Alternately, the liners might be displaced therefrom, thereby defining a significantly reduced volume chamber, or subchamber, within which the substrate is received for deposition. One advantage of using liners is that they can be periodically replaced with new or cleaned liners, thereby extending the life of the deposition chambers. Further and regardless, the spent liners can typically be removed and replaced much more quickly than the time it would take to clean the internal chamber walls at a given cleaning interval.

A typical chemical vapor deposition apparatus includes a deposition chamber which connects to a transfer chamber through a passageway. Substrates are transferred into and out of the deposition chamber by a robotic arm assembly which passes through the passageway from the transfer chamber. Typically, the deposition chamber and transfer chamber are maintained at subatmospheric pressure in operation. The deposition chamber is typically maintained at a slightly lower subatmospheric pressure than is the transfer chamber. Once positioned within the deposition chamber, a mechanical gate or door received within the transfer chamber is moved to a sealing position to cover the passageway within the transfer chamber. Further, some passageways are provided with a plurality of inert gas ports through which inert purge gas is emitted, at least during deposition, to form an inert gas curtain within the passageway. A desired intent or effect of the inert gas curtain is to preclude deposition product from depositing within the passageway. The inert gas forming the curtain is ultimately drawn to within the deposition chamber and passes out the vacuum foreline from the chamber.

Unfortunately, the flow of inert purge gas from the passageway can adversely impact the deposition upon the substrate received therewithin. For example, some of the inert gas will inherently be caused to flow over the wafer surface from the side of the substrate which is proximate the passageway. Other sides/edges of the wafer surface are not subjected to the same inert gas flow. This can have an adverse effect on the deposition. One prior art method of attempting to alleviate the impact from such inert purge gas flow is to provide inert purge gas injection into the deposition chamber proximate the other edges/sides of the substrate.

The invention was motivated in addressing or overcoming the above-described drawbacks, although it is in no way so limited. The invention is only limited by the accompanying claims as literally worded without interpretative or other limiting reference to the specification or drawings, and in accordance with the doctrine of equivalents.

SUMMARY

The invention includes chemical vapor deposition apparatus. In one implementation, a chemical vapor deposition apparatus includes a subatmospheric substrate transfer chamber. Such further includes a subatmospheric deposition chamber defined at least in part by a chamber sidewall. A passageway in the chamber sidewall extends from the transfer chamber to the deposition chamber. Semiconductor substrates pass into and out of the deposition chamber through the passageway for deposition processing. A mechanical gate is included within at least one of the deposition chamber and the sidewall passageway, and is configured to open and close at least a portion of the passageway to the chamber.

In one implementation, a chemical vapor deposition apparatus includes a chamber defined at least in part by a chamber sidewall. A passageway in the chamber sidewall extends from externally of the chamber to the chamber. Semiconductor substrates pass into and out of the chamber through the passageway for deposition processing. A chamber liner apparatus forms a deposition subchamber within the chamber. At least a portion of the chamber liner apparatus is selectively movable to fully expose and to fully cover the passageway to the chamber.

Further implementations are contemplated.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
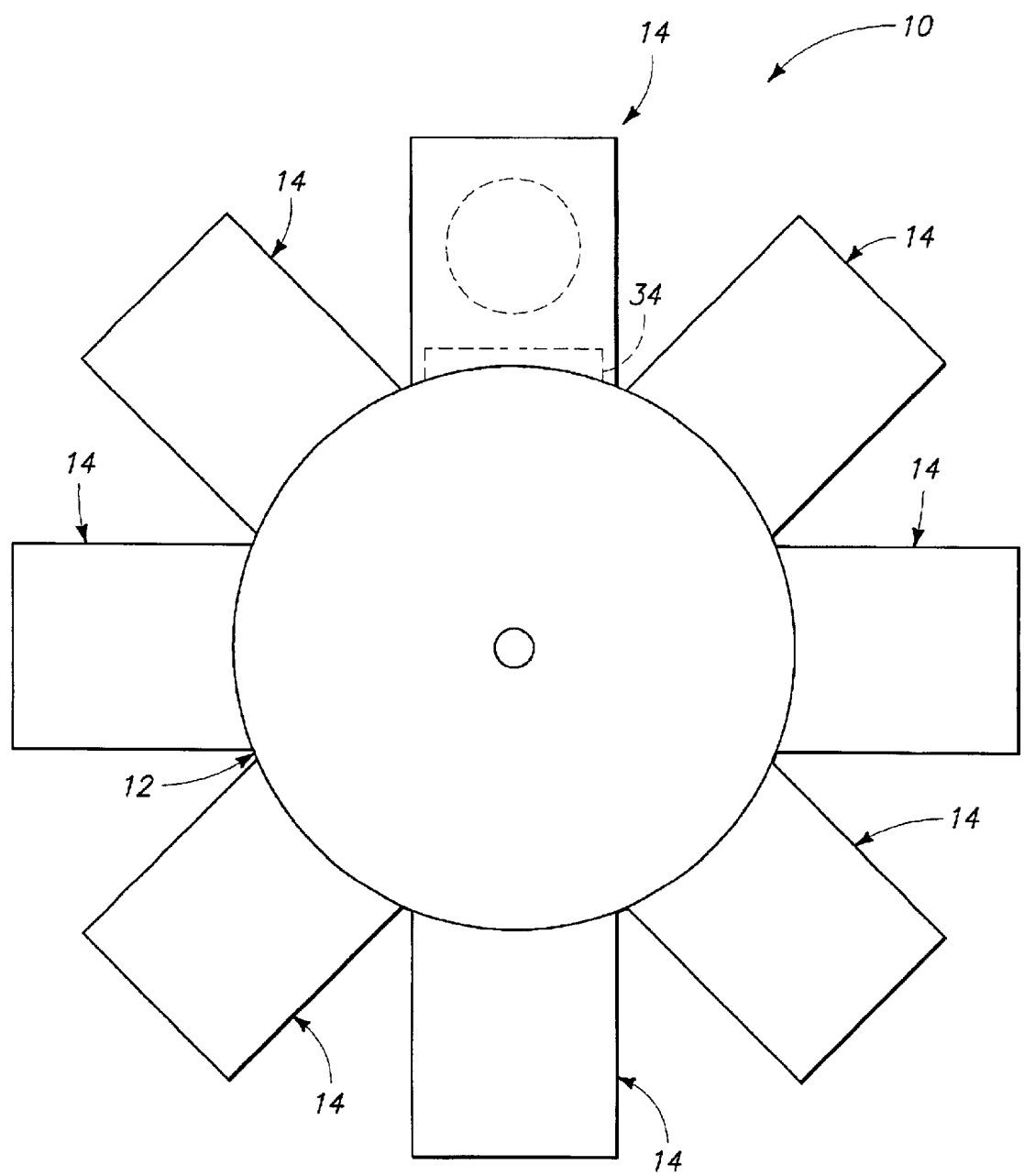
FIG. 1 is a diagrammatic top plan view of a chemical vapor deposition cluster processing apparatus in accordance with an aspect of the invention.

Referring to FIG. 1, an exemplary embodiment chemical vapor deposition apparatus in accordance with an aspect of the invention is indicated generally with reference numeral 10. Such includes a subatmospheric transfer chamber 12 having a plurality of substrate processors or load lock chambers 14 peripherally received thereabout. Load lock chambers are utilized to transfer semiconductor substrates, typically individually, from room ambient to within processor 10 for deposition or other processing within the processing chambers 14. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

A suitable mechanism (not shown) would be associated with subatmospheric transfer chamber 12 for transferring the substrates into and out of the respective processors 14. Further, a vacuum exhaust line/foreline (not shown) would be associated with chamber 16 for providing/maintaining desired pressure within the chamber. Of course, the depicted apparatus 10 and processor chambers 14 are only exemplary. The concluding claims are in no way limited by the environment, but for the literal wording appearing in such claims, and without limiting or interpretative reference to the specification or drawings, and in accordance with the doctrine of equivalents.

Figure 2:
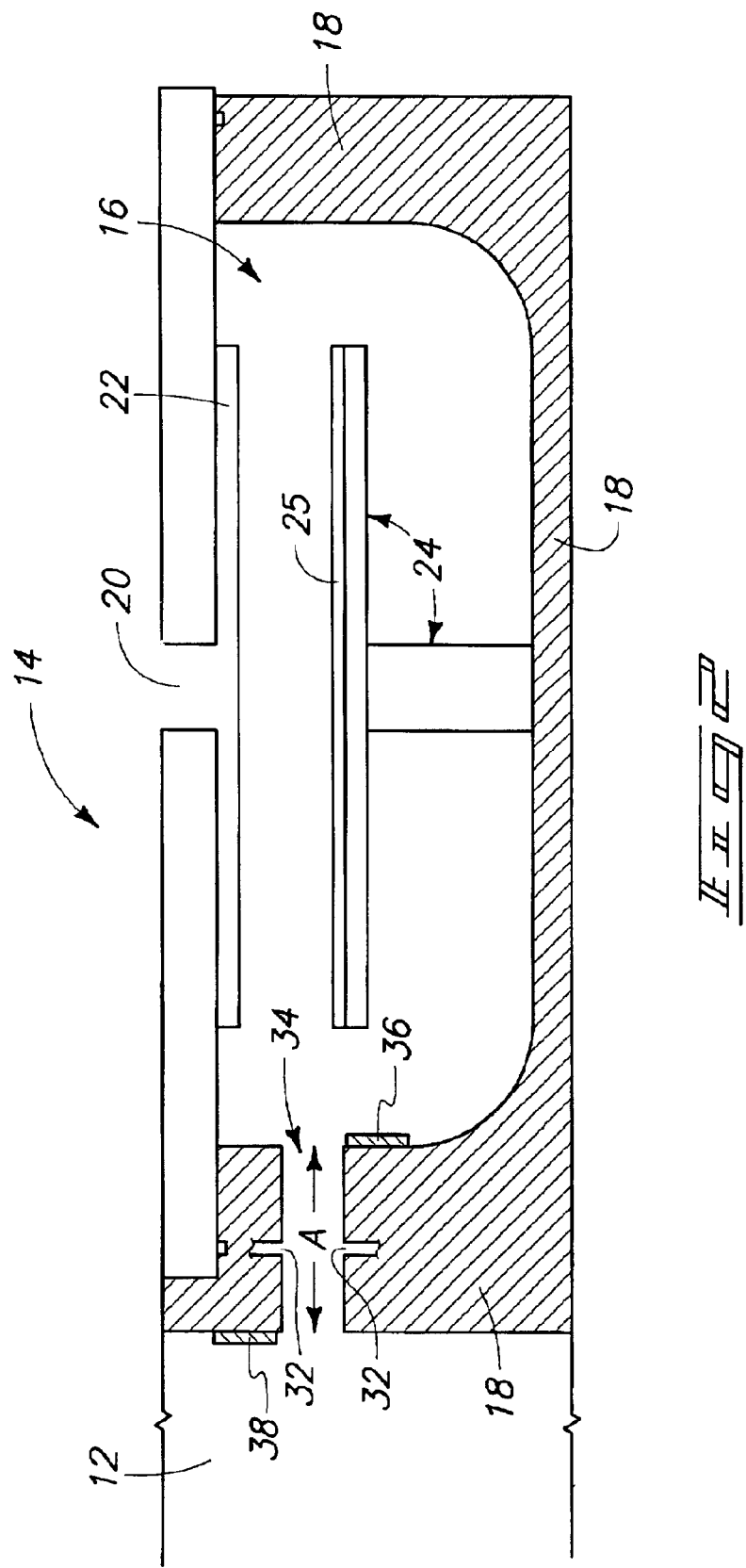
FIG. 2 is an enlarged diagrammatic sectional view of a portion of the apparatus of FIG. 1 shown in one operational configuration.

Referring to FIGS. 1 and 2, deposition processor 10 includes a semiconductor substrate deposition chamber 16 which will typically be at subatmospheric pressure during deposition processing. Such includes internal walls 18. In the depicted example, processor 14 is shown in the form of an ALD or other CVD processor chamber having an exemplary gas inlet 20, diagrammatically shown at the top, for injecting one or more precursor gasses to within chamber 16. A showerhead 22 is fed by inlet 20. A substrate holder 24 is received within deposition chamber 16, and is diagrammatically shown as having a semiconductor substrate 25 received thereatop. Substrate holder 24 is preferably mounted for elevational movement for raising and lowering substrate 25 relative to showerhead 22.

A passageway 34 is received within the depicted chamber sidewall 18 and extends from externally of the chamber (in the preferred, depicted embodiment from transfer chamber 12) to deposition chamber 16. Such is sized and otherwise configured for passing semiconductor substrates into and out of deposition chamber 16 for deposition processing. By way of example only, one exemplary existing passageway has a maximum height of 0.75 inch and a maximum width of 8.25 inches, with the width ends thereof being rounded. In the depicted preferred embodiment, passageway 34 includes at least one, and preferably more, purge gas inlets 32 received therein. Such are ideally configured or otherwise arranged for establishing a gas curtain within passageway 34. In the depicted embodiment, passageway 34 extends through chamber wall 18 along a shortest possible straight line "A" from transfer chamber 12 to deposition chamber 16, and which also defines a length of the passageway from the transfer chamber to the deposition chamber.

In one implementation, a mechanical gate is received within at least one of the deposition chamber and the sidewall passageway, and is configured to open and close at least a portion of the passageway to the chamber. In one implementation, a gate, preferably a mechanical gate, is associated with the passageway downstream of the passageway purge gas inlets, where such are utilized, and is configured to open and close at least a portion of the passageway to the chamber. In the context of this document, "downstream" refers to a direction of flow of the purge gas from the inlets toward the vacuum outlet from the deposition chamber. Referring more specifically to FIG. 2, chemical vapor deposition apparatus 10 is depicted as having a mechanical gate 36 which is received within and mounted for movement within deposition chamber 16. Another mechanical gate 38 is depicted within transfer chamber 12.

Figure 3:
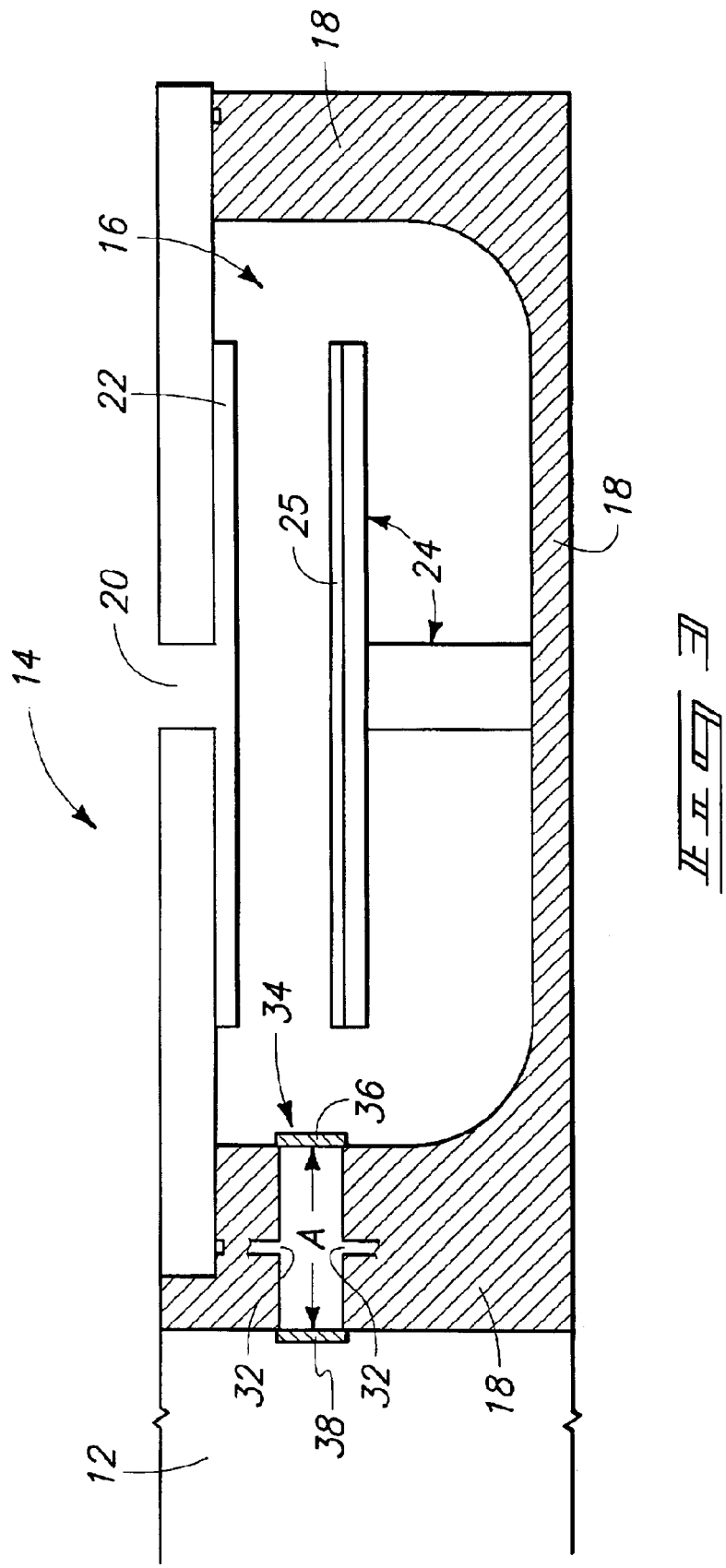
FIG. 3 is a diagrammatic sectional view like FIG. 2 but shown in another operational orientation.

Referring to FIGS. 2 and 3, mechanical gate 36 is depicted as being mounted for sliding movement, for example elevational sliding movement, and otherwise sized and configured to open and close passageway 34 along all of passageway length "A" and across a total opening cross section of the passageway immediately proximate gate 36. Further, mechanical gate 36 is configured and mounted for sliding movement which is perpendicular to straight line "A". Mechanical gate 38 within transfer chamber 12 is also depicted as being configured to open and close all of passageway 34 to transfer chamber 12. Mechanical gate 36 might be eccentrically or otherwise pivotally, rotatably, hinge, or otherwise mounted for moving between a preferred illustrated fully opened position (FIG. 2) and a passageway closed position (FIG. 3). Further most preferably as shown, mechanical gate 36 is received downstream of purge gas inlets 32. In this preferred manner, purge gas otherwise emitted from purge gas inlets 32 is precluded or otherwise restricted from flowing across the surface of wafer 25 during deposition processing, in a preferred embodiment operation.

Figure 4:
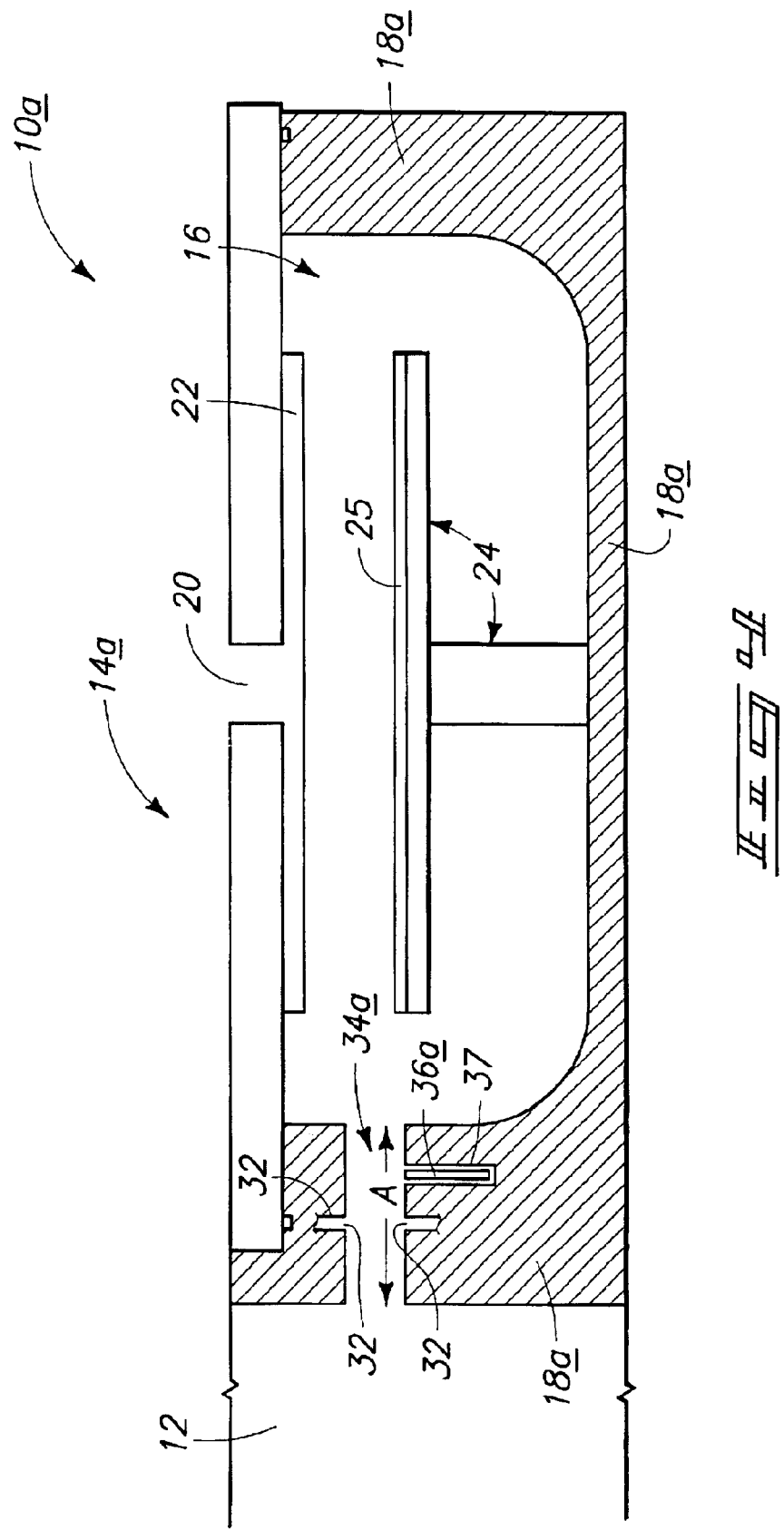
FIG. 4 is an enlarged sectional view of a portion of an alternate embodiment chemical vapor deposition apparatus in accordance with an aspect of the invention and shown in one operational configuration.
Figure 5:
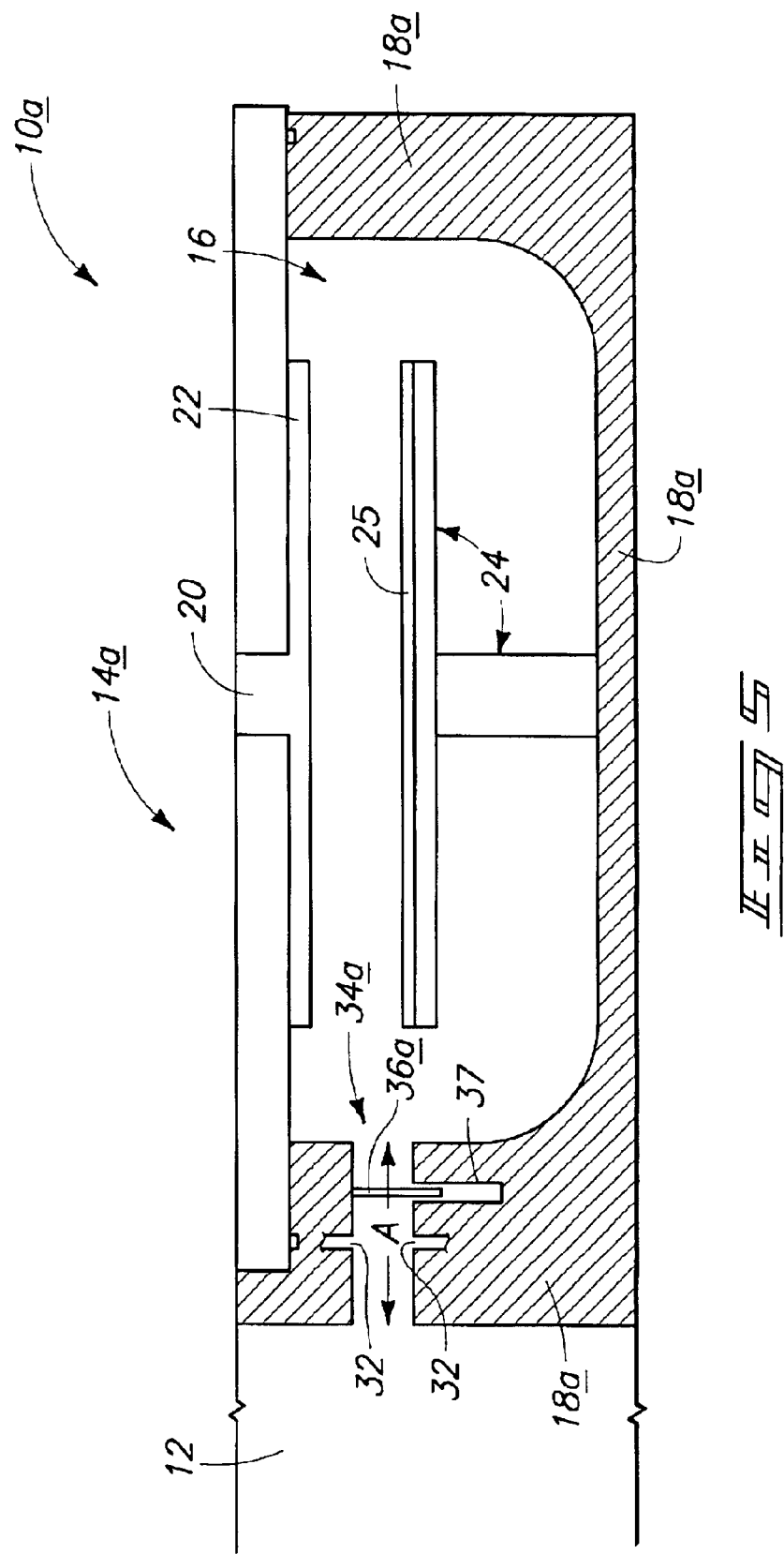
FIG. 5 is a diagrammatic sectional view like FIG. 4 but shown in another operational orientation.

FIGS. 2 and 3 depict an embodiment wherein a mechanical gate is mounted for movement within the deposition chamber, and whereby such gate is configured to open and close the passageway all along length "A" of such passageway. FIGS. 4 and 5 depict an alternate embodiment chemical vapor deposition apparatus 10a wherein a gate is mounted for movement within the passageway, and is configured to open and close the passageway along only a portion of passageway length "A". Like numerals from the first-described embodiment are utilized where appropriate, with differences being indicated with the suffix "a" or with different numerals. FIGS. 4 and 5 depict a gate receiving receptacle 37 received within sidewall 18a of a chemical vapor deposition apparatus 10a. A mechanical gate 36a is received within receptacle 37, and is mounted for slidable or other movement therein to provide passageway 34a in a fully open (FIG. 4) or closed (FIG. 5) position. In the depicted preferred embodiment, gate 36a is configured and positioned to be able to open and close all of the illustrated passageway cross section cutting through length "A", but is configured to open and close the passageway only along a portion of passageway length "A".

Figure 6:
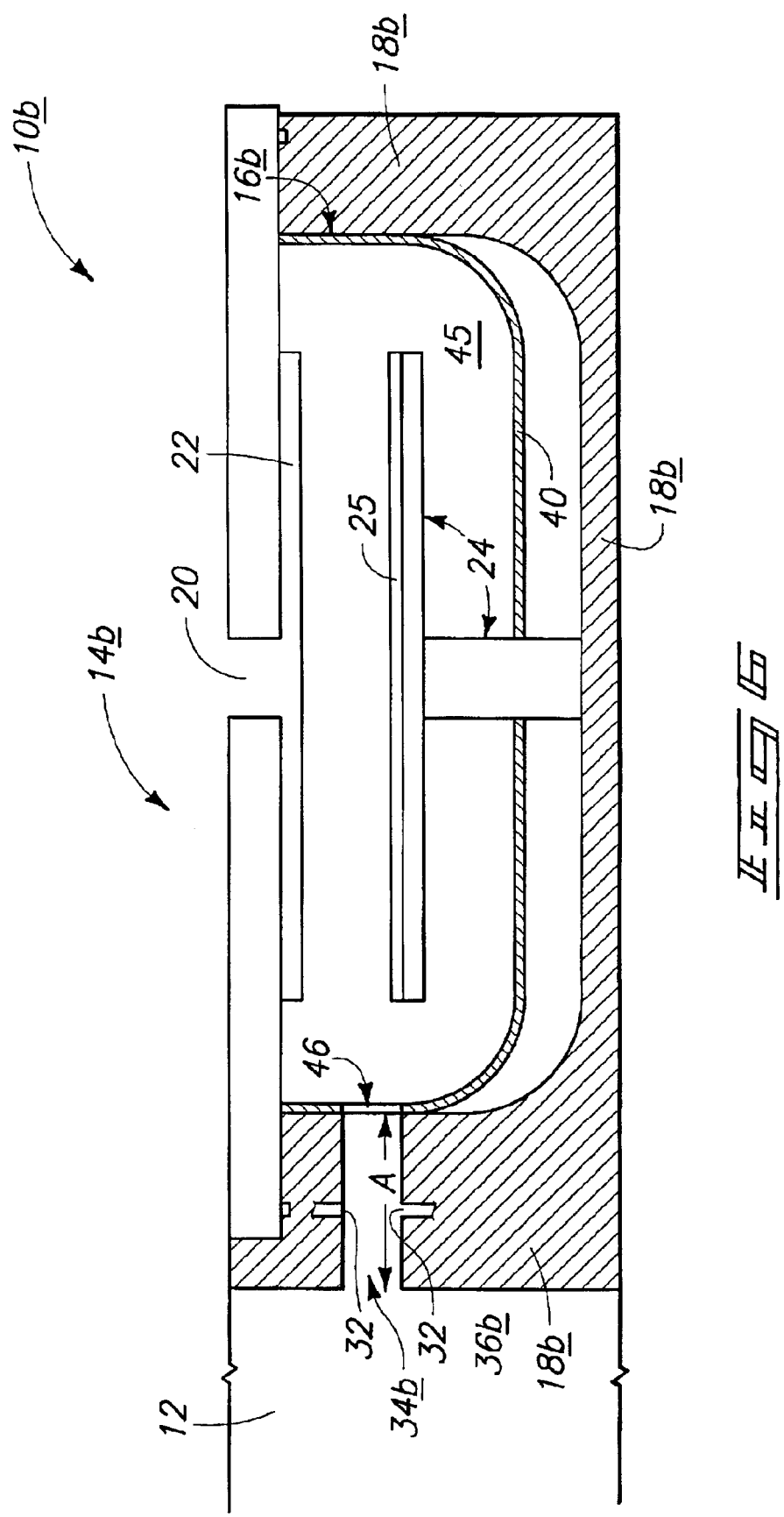
FIG. 6 is an enlarged sectional view of a portion of another alternate embodiment chemical vapor deposition apparatus in accordance with an aspect of the invention and shown in one operational configuration.
Figure 7:
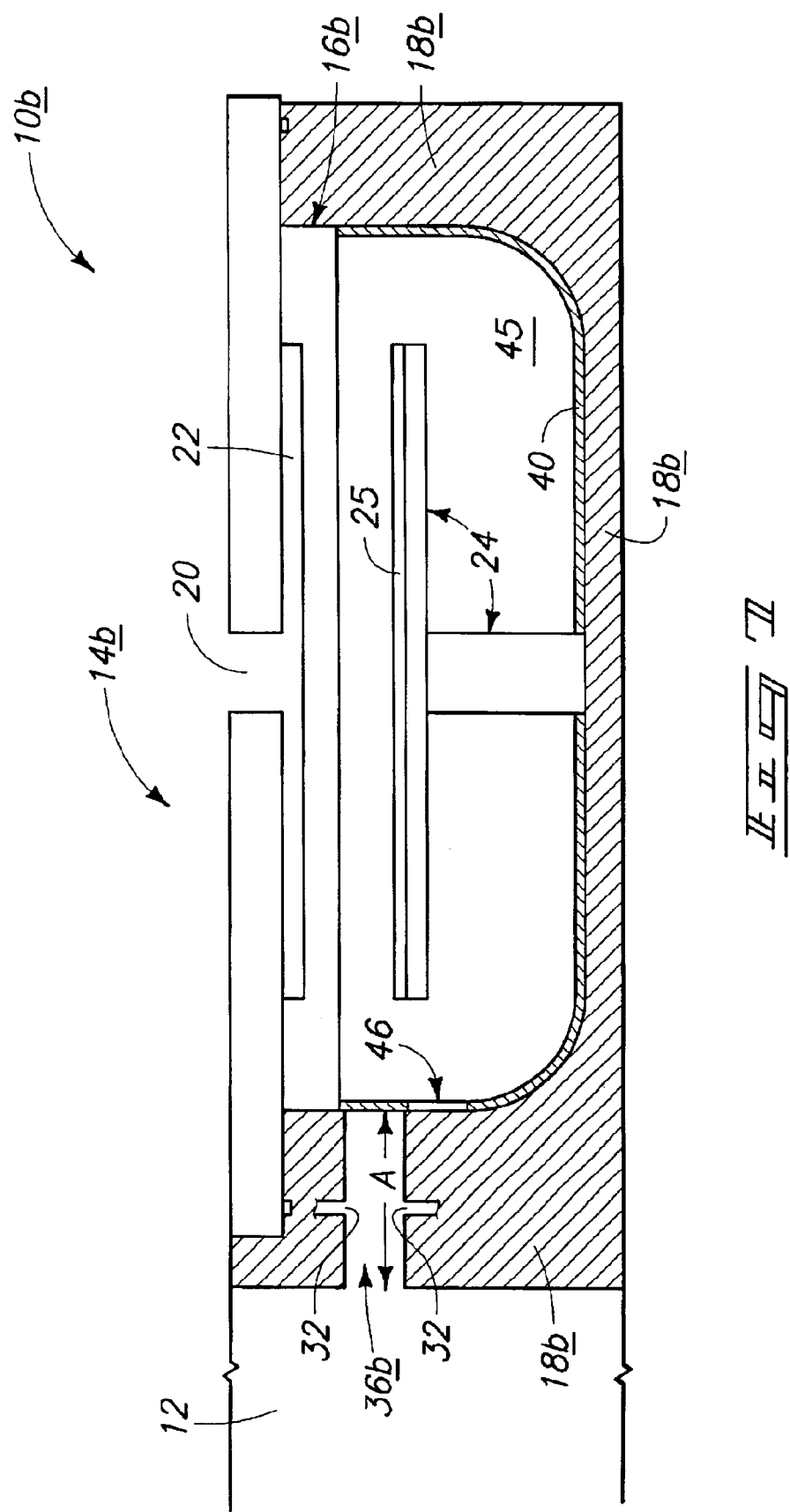
FIG. 7 is a diagrammatic sectional view like FIG. 6 but shown in another operational orientation.

Another exemplary alternate embodiment chemical vapor deposition apparatus 10b in accordance with aspects of the invention is next described with reference to FIGS. 6 and 7. Like numerals from the first-described embodiments are utilized where appropriate, with differences being indicated with the suffix "b" or with different numerals. FIGS. 6 and 7 depict chemical vapor deposition apparatus 10b as comprising a chamber liner apparatus 40, a portion of which is configured to operate as a mechanical gate in accordance with the first-described embodiment. Regardless, chamber liner apparatus 40 is received within chamber 16b and forms a deposition subchamber 45 therewithin. Liner apparatus 40 has a substrate opening 46 extending therethrough. Preferably, opening 46 is at least as large as the total open cross section of passageway 34b where it joins with chamber 16b. In one preferred embodiment, opening 46 has a cross-sectional shape which is the same as that of the total open cross section of passageway 34b where it joins with chamber 16b. Further in one preferred implementation, opening 46 has both a size and a shape which is the same of that of the total open cross section of passageway 34b where it joins with chamber 16b.

Liner apparatus 40 is mounted for movement to a first position (FIG. 6) in which the opening is aligned with passageway 34b, and to a second position (FIG. 7) in which the opening is not aligned with passageway 34b. Further in the FIGS. 6 and 7 depicted preferred embodiment, at least a portion of liner apparatus 40 is selectively moveable to fully expose passageway 34b to chamber 16b (FIG. 6) and to fully cover passageway 34b to chamber 16b (FIG. 7). Further in the depicted embodiment, liner apparatus 40 and the portion thereof is mounted for elevational movement, with upward movement of the portion to the first position (FIG. 6) fully exposing passageway 34b, and downward movement of the portion to the second position (FIG. 7) fully covering passageway 34b. Alternately but less preferred, the liner apparatus might be configured or operated to less than fully cover passageway 34b in what would be a partially blocking position (not shown). Further alternately and by way of example only, the liner apparatus might be displaced from the sidewalls forming chamber 16b such that a void space is provided between the liner and passageway 34b, and such that passageway 34b is not partially or otherwise blocked from exposure to chamber 16b. Such gap or void space might be provided with other inert gas injection, for example, to prevent deposition product or effluent build-up in such gap.

Figure 8:
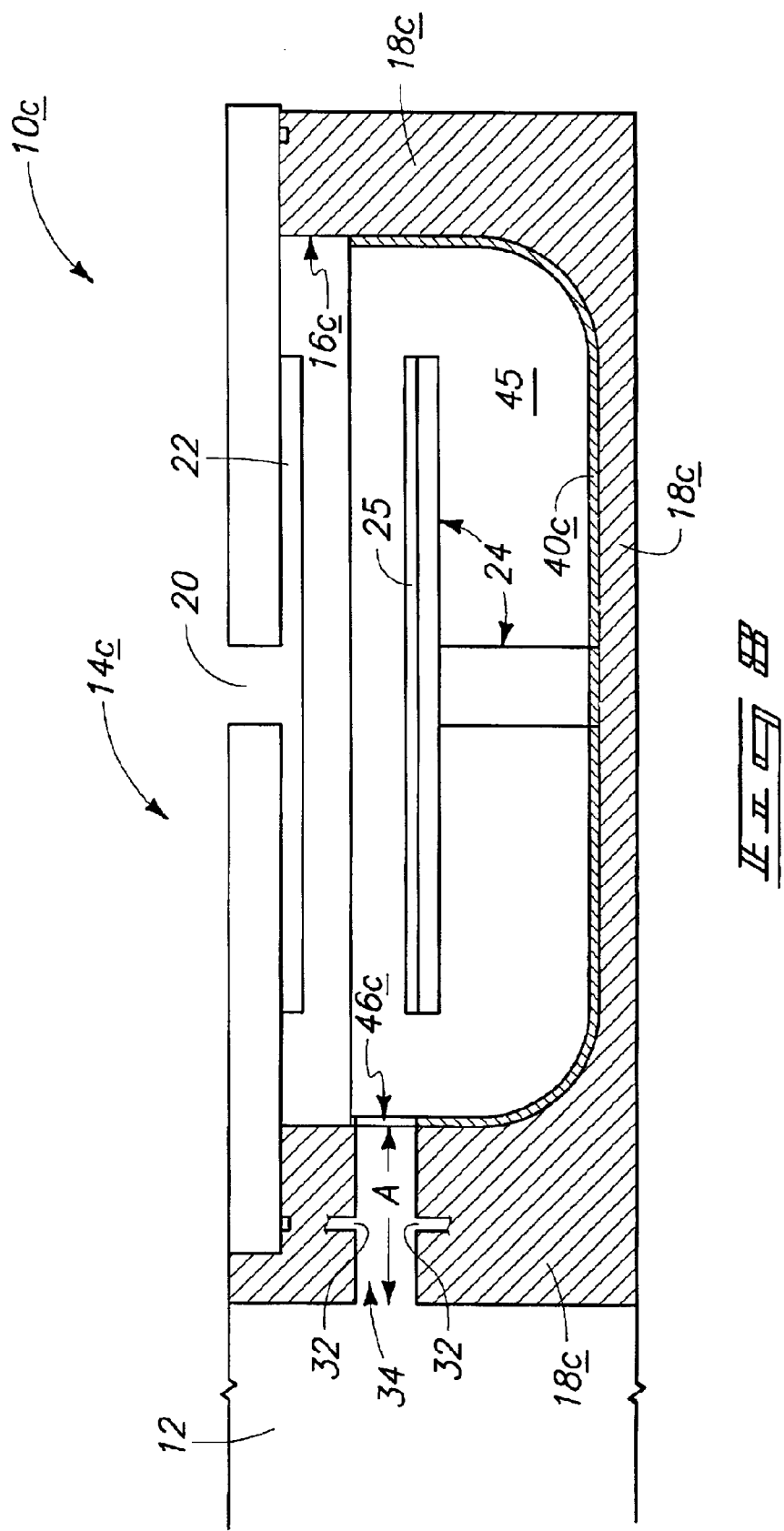
FIG. 8 is an enlarged sectional view of a portion of another alternate embodiment chemical vapor deposition apparatus in accordance with an aspect of the invention and shown in one operational configuration.
Figure 9:
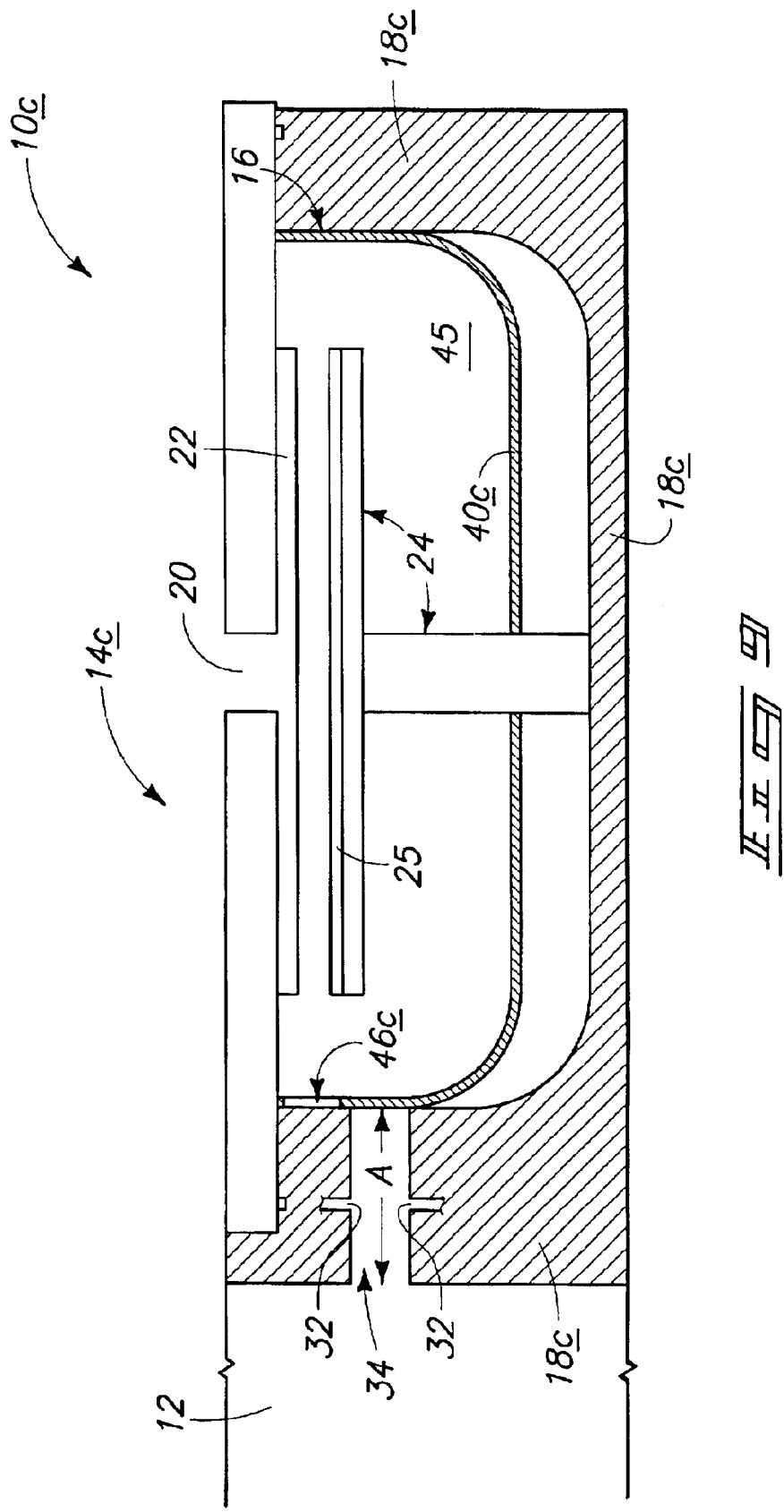
FIG. 9 is a diagrammatic sectional view like FIG. 8 but shown in another operational orientation.

FIGS. 8 and 9 depict an exemplary alternate chemical vapor deposition apparatus 10c. Like numerals from the first-described embodiments are utilized where appropriate, with differences being indicated with the suffix "c" or with different numerals. A chamber liner apparatus 40c is depicted as having an opening 46c positioned slightly different than in the FIGS. 6–7 embodiment. Specifically, the exemplary opening 46c is provided such that upward movement of chamber liner apparatus 40c to a first position (FIG. 9) fully covers passageway 34, while downward movement of liner apparatus 40c to a second position (FIG. 8) fully exposes passageway 34. Further, FIGS. 6 and 7 depicted an embodiment whereby at least the moveable portion of the chamber liner apparatus was mounted for movement independent of movement of the substrate holder. Of course, alternate embodiments are contemplated, for example whereby the substrate holder is moveable and the chamber liner apparatus is mounted for movement with the movement of the substrate holder. By way of example only, FIGS. 8 and 9 diagrammatically depict such an embodiment. Here, liner 40c is effectively connected with substrate holder 24 such that raising and lowering of the same also moves liner apparatus 40c.

Figure 10:
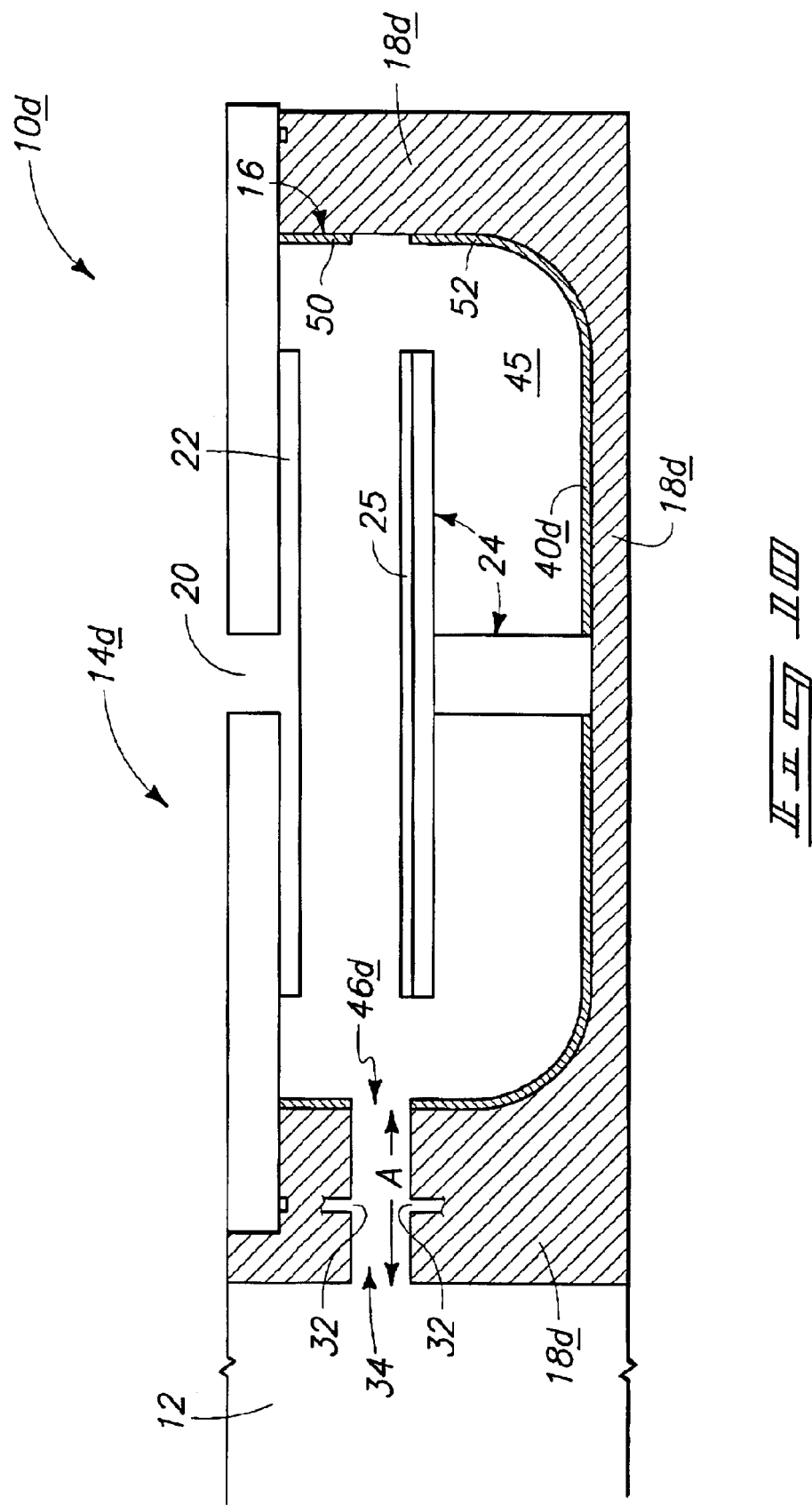
FIG. 10 is an enlarged sectional view of a portion of still another alternate embodiment chemical vapor deposition apparatus in accordance with an aspect of the invention and shown in one operational configuration.
Figure 11:
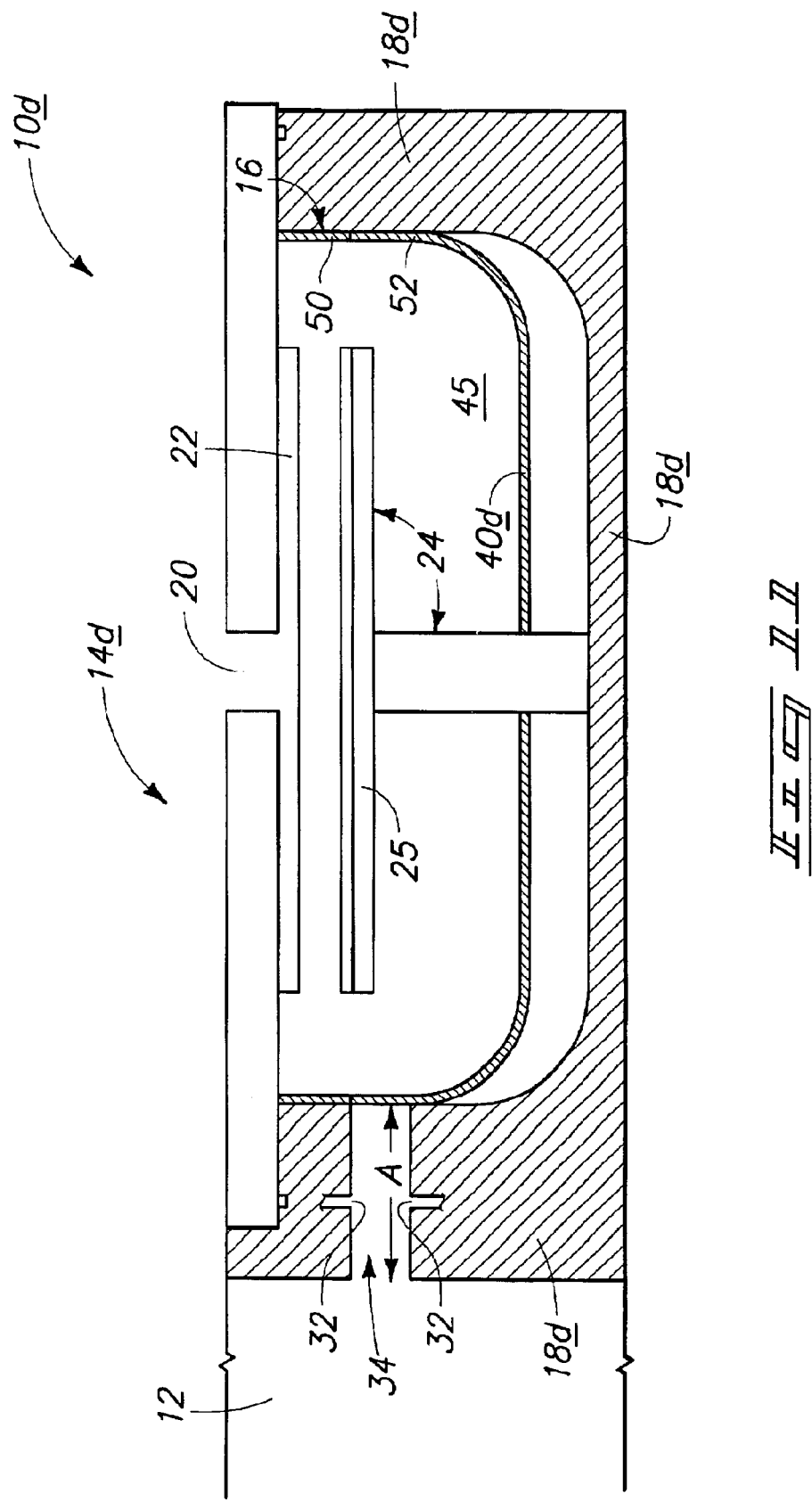
FIG. 11 is a diagrammatic sectional view like FIG. 10 but shown in another operational orientation.

The illustrated FIGS. 6–7 and FIGS. 8–9 embodiments depict the entirety of the respective liner apparatuses as being selectively moveable, and to fully expose and to fully cover the passageway to the chamber. FIGS. 10 and 11 depict an exemplary alternate embodiment whereby only a portion of the liner apparatus is selectively moveable and to fully expose and to fully cover the passageway to the chamber, with another portion of the liner apparatus not being mounted for such movement. Specifically, FIGS. 10 and 11 depict an alternate embodiment chemical vapor deposition apparatus 10d. Like numerals from the first-described embodiments are utilized where appropriate, with differences being indicated with the suffix "d", or with different numerals. FIG. 10 depicts liner apparatus 40d as having a stationary upper portion 50 and a moveable lower portion 52. FIG. 10 depicts lower portion 52 in an elevationally lowest portion, providing exposure of passageway 34 to chamber 16d. FIG. 11 depicts lower portion 52 of liner apparatus 40d in a raised position, which effectively closes, fully closes as shown, passageway 34 from exposure to chamber 16d.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A chemical vapor deposition apparatus comprising:
   a subatmospheric substrate transfer chamber;
   a subatmospheric deposition chamber defined at least in part by a chamber sidewall;
   a passageway in the chamber sidewall extending from the transfer chamber to the deposition chamber, and through which semiconductor substrates pass between the transfer chamber and the deposition chamber for deposition processing; the passageway extending through the chamber sidewall along a shortest possible straight line from the transfer chamber to the deposition chamber, the passageway having a top and bottom;
   a pair of top and bottom opposing purge gas inlets received within the passageway, the top and bottom opposing purge gas inlets being received along a straight line which is perpendicular to said shortest possible straight line from the transfer chamber to the deposition chamber; and
   a gate associated with the passageway downstream of the passageway purge gas inlets and configured to open and close at least a portion of the passageway to the chamber, the gate being a mechanical gate mounted for movement which is perpendicular to said shortest possible straight line from the transfer chamber to the deposition chamber.

2. The apparatus of claim 1 wherein the passageway has a total open cross section immediately proximate the gate, the gate being configured to open and close all of said passageway cross section.

3. The apparatus of claim 2 wherein the passageway has a total length from the transfer chamber to the deposition chamber, the gate being configured to open and close the passageway along all of said passageway length.

4. The apparatus of claim 1 wherein the gate is mounted for movement within the passageway.

5. The apparatus of claim 4 wherein the passageway has a total open cross section immediately proximate the gate, the gate being configured to open and close all of said passageway cross section.

6. The apparatus of claim 4 wherein the passageway has a length from the transfer chamber to the deposition chamber, the gate being configured to open and close the passageway along only a portion of said passageway length.

7. The apparatus of claim 1 wherein the gate is mounted for movement within the deposition chamber.

8. The apparatus of claim 7 wherein the passageway has a total open cross section immediately proximate the gate, the gate being configured to open and close all of said passageway cross section.

9. The apparatus of claim 1 further comprising a mechanical gate within the transfer chamber configured to open and close all of the passageway to the transfer chamber.

10. The apparatus of claim 1 further comprising a chamber liner apparatus forming a deposition subchamber within the deposition chamber, the gate comprising a portion of the chamber liner apparatus.

11. The apparatus of claim 1 wherein the pair of top and bottom opposing purge gas inlets are configured to emit purge gas along said straight line which is perpendicular to said shortest possible straight line from the transfer chamber to the deposition chamber.

12. The apparatus of claim 4 wherein the pair of top and bottom opposing purge gas inlets are configured to emit purge gas along said straight line which is perpendicular to said shortest possible straight line from the transfer chamber to the deposition chamber.

13. The apparatus of claim 7 wherein the pair of top and bottom opposing purge gas inlets are configured to emit purge gas along said straight line which is perpendicular to said shortest possible straight line from the transfer chamber to the deposition chamber.

14. The apparatus of claim 4 wherein the passageway comprises at least a portion defined by a unitary chamber wall portion, the unitary chamber wall portion including a gate receiving receptacle which slidably receives the mechanical gate, the opposing top bottom purge gas inlets being received within the unitary chamber wall portion.

15. The apparatus of claim 14 wherein the pair of top and bottom opposing purge gas inlets are configured to emit purge gas from the unitary wall portion along said straight line which is perpendicular to said shortest possible straight line from the transfer chamber to the deposition chamber.

* * * * *